US012658875B2

(12) United States Patent
Yen

(10) Patent No.: US 12,658,875 B2
(45) Date of Patent: *Jun. 16, 2026

(54) BULK ACOUSTIC WAVE RESONATORS HAVING CONVEX SURFACES, AND METHODS OF FORMING THE SAME

(71) Applicant: Texas Instruments Incorporated, Dallas, TX (US)

(72) Inventor: Ting-Ta Yen, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/903,281

(22) Filed: Oct. 1, 2024

(65) Prior Publication Data

US 2025/0023538 A1 Jan. 16, 2025

Related U.S. Application Data

(60) Division of application No. 18/449,098, filed on Aug. 14, 2023, now Pat. No. 12,119,803, which is a
(Continued)

(51) Int. Cl.
*H03H 9/02* (2006.01)
*H03H 3/02* (2006.01)
*H03H 9/17* (2006.01)

(52) U.S. Cl.
CPC ............ *H03H 9/0211* (2013.01); *H03H 3/02* (2013.01); *H03H 9/02015* (2013.01); *H03H 9/02157* (2013.01); *H03H 2003/021* (2013.01); *H03H 2003/025* (2013.01); *H03H 9/02047* (2013.01); *H03H 9/172* (2013.01)

(58) Field of Classification Search
CPC ............ H03H 9/0211; H03H 9/02015; H03H 9/02157; H03H 9/02047; H03H 9/172; H03H 3/02; H03H 2003/021; H03H 2003/025
See application file for complete search history.

(56) References Cited

U.S. PATENT DOCUMENTS 3,988,703 A 10/1976 Devries
4,188,557 A 2/1980 Mattuschka
(Continued)

FOREIGN PATENT DOCUMENTS

CN 102291095 A 12/2011
CN 101895269 B 9/2012
(Continued)

OTHER PUBLICATIONS

Adachi et al., "Investigation of Spurious Modes of Convex OT-Cut Quartz Crystal Resonators," Proc. 35th Annual Freq Control Symposium, USAERADCOM, Ft. Monmouth, NJ, May 1981, 8 pages.
(Continued)

*Primary Examiner* — Jeffrey M Shin
(74) *Attorney, Agent, or Firm* — Zhenhai Fu; Frank D. Cimino

(57) ABSTRACT

In one example, an apparatus comprises an acoustic resonator, the acoustic resonator including: an electrode; and a piezoelectric layer on the electrode, in which the electrode covers entirely a surface of the piezoelectric layer, and the piezoelectric layer has a convex portion with a non-uniform thickness.

20 Claims, 3 Drawing Sheets

Related U.S. Application Data division of application No. 16/902,008, filed on Jun. 15, 2020, now Pat. No. 11,742,825, which is a continuation of application No. 15/639,552, filed on Jun. 30, 2017, now Pat. No. 10,686,425.

(56)                References Cited

U.S. PATENT DOCUMENTS

| | | | |
|---|---|---|---|
| 4,193,473 A | 3/1980 | Hartemann | |
| 4,625,138 A | 11/1986 | Ballato | |
| 4,985,655 A | 1/1991 | Jensik | |
| 5,747,857 A | 5/1998 | Eda | |
| 5,767,612 A | 6/1998 | Takeuchi | |
| 6,049,158 A | 4/2000 | Takeuchi | |
| 6,087,198 A | 7/2000 | Panasik | |
| 6,094,294 A | 7/2000 | Yokoyama | |
| 6,548,942 B1 | 4/2003 | Panasik | |
| 6,842,088 B2 | 1/2005 | Yamada | |
| 7,067,964 B1 | 6/2006 | Kosinski | |
| 7,418,772 B2 | 9/2008 | Nishiyama | |
| 7,621,624 B2 | 11/2009 | Pan | |
| 7,675,389 B2 | 3/2010 | Yamakawa | |
| 7,714,684 B2 | 5/2010 | Ruby | |
| 7,786,826 B2 | 8/2010 | Thalhammer | |
| 7,812,502 B2 | 10/2010 | Zalalutdinov | |
| 7,893,597 B2 | 2/2011 | Nishimura | |
| 7,939,987 B1 | 5/2011 | Solal | |
| 8,215,171 B1 | 7/2012 | Allan | |
| 8,456,257 B1 | 6/2013 | Fattinger | |
| 8,941,286 B2 | 1/2015 | Taniguchi | |
| 9,232,289 B2 | 1/2016 | Bahr | |
| 9,577,603 B2 | 2/2017 | Burak | |
| 9,663,346 B1 | 5/2017 | Bahr | |
| 9,673,376 B1 | 6/2017 | Krivokapic | |
| 9,876,483 B2 | 1/2018 | Ortiz | |
| 10,615,772 B2 | 4/2020 | Yen | |
| 10,686,425 B2 | 6/2020 | Yen | |
| 11,742,825 B2 | 8/2023 | Yen | |
| 12,119,803 B2 * | 10/2024 | Yen | H03H 3/02 |
| 2004/0070313 A1 | 4/2004 | Furukawa | |
| 2005/0093656 A1 | 5/2005 | Larson, III | |
| 2006/0255696 A1 | 11/2006 | Sato | |
| 2009/0295505 A1 | 12/2009 | Mohammadi | |
| 2011/0121916 A1 | 5/2011 | Barber | |
| 2012/0086523 A1 | 4/2012 | Meltaus | |
| 2013/0033337 A1 | 2/2013 | Nishihara | |
| 2013/0214879 A1 | 8/2013 | Gorisse | |
| 2014/0225684 A1 | 8/2014 | Kando | |
| 2014/0273881 A1 | 9/2014 | Tajic | |
| 2015/0280688 A1 | 10/2015 | Ortiz | |
| 2018/0205362 A1 | 7/2018 | Kishimoto | |

FOREIGN PATENT DOCUMENTS

| | | |
|---|---|---|
| CN | 102066919 B | 7/2014 |
| CN | 104868871 A | 8/2015 |
| CN | 105262456 B | 7/2018 |
| CN | 106341095 B | 4/2020 |
| CN | 106899275 B | 7/2020 |

OTHER PUBLICATIONS

Bahr et al., "Optimization of Unreleased CMOS-MEMS RBTs," Frequency Control Symposium (IFCS), 2016 IEEE International, 4 pages.
Bahr et al., "Theory and Design of Phononic Crystals for Unreleased CMOS-MEMS Resonant Body Transistors," Journal of Microelectromechanical Systems, vol. 24, No. 5, Oct. 2015, 14 pages.
Bahr et al., "Vertical Acoustic Confinement for High-Q Fully-Differential CMOS-RBTS," Solid-State Sensors, Actuators and Microsystems Workshop, Hilton Head), 2016, 4 pages.
Bahr, "Monolithically Integrated MEMS Resonators and Oscillators in Standard IC Technology," Doctoral Thesis, Massachusetts Institute of Technology, May 18, 2016, 255 pages.
C.J. Wilson, "Vibration modes of AT-cut convex quartz resonators," J. Phys. D: Appl. Phys., vol. 7, 1974, 7 pages.
China National Intellectual Property Administration, Office Action, Dec. 22, 2022.
China National Intellectual Property Administration, Office Action, Feb. 21, 2023.
Gorishnyy et al., "Sound ideas," Physics World, Dec. 2005, 6 pages.
Federal Institute of Industrial Property, International Search Report for PCT/US2018/043612 mailed Oct. 18, 2018, 2 pages.
Lin et al., "Quality Factor Enhancement in Lamb Wave Resonators Utilizing ALN Plates with Convex Edges," IEEE, Transducers '11, Beijing, China, Jun. 5-9, 2011, 4 pages.
Wang et al., "Resonant Body Transistors in Standard CMOS Technology," Oct. 2012, 7 pages.
Wang et al., "Tapered Phononic Crystal Saw Resonator in Gan," MEMS 2015, Estoril, Portugal, Jan. 18-22, 2015, IEEE, 4 pages.

* cited by examiner

BULK ACOUSTIC WAVE RESONATORS HAVING CONVEX SURFACES, AND METHODS OF FORMING THE SAME

CROSS-REFERENCE TO RELATED APPLICATION

This application is a division of U.S. patent application Ser. No. 18/449,098, filed Aug. 14, 2023, which is a division of U.S. patent application Ser. No. 16/902,008, filed Jun. 15, 2020 (now U.S. Pat. No. 11,742,825), which is a continuation of U.S. patent application Ser. No. 15/639,552 filed Jun. 30, 2017 (now U.S. Pat. No. 10,686,425), which are incorporated herein by reference.

BACKGROUND

This relates generally to bulk acoustic wave (BAW) resonators, and more particularly to BAW resonators having convex surfaces, and methods of forming the same.

In BAW resonators, electrodes (e.g., contacts, metal patches, etc.) on top and bottom surfaces of a piezoelectric layer provide voltage bias to excite acoustic waves through piezoelectric (and reverse piezoelectric) effect. The bulk acoustic waves of specific frequencies are generated within the resonant cavity between the top and bottom surfaces of the piezoelectric layer to form a resonance response.

SUMMARY

BAW resonators having convex surfaces, and methods of forming the same are disclosed. An example BAW resonator includes a first (e.g., a bottom) electrode, a piezoelectric layer formed on the first electrode, the piezoelectric layer having a convex surface, and a second (e.g., a bottom) electrode formed on the convex surface. An example integrated circuit (IC) package includes a BAW resonator disposed in the IC package, the BAW resonator including a piezoelectric layer having a convex surface. In some examples, the BAW resonator is integrated with an IC die in the IC package.

DETAILED DESCRIPTION OF EXAMPLE EMBODIMENTS

Figure 1:
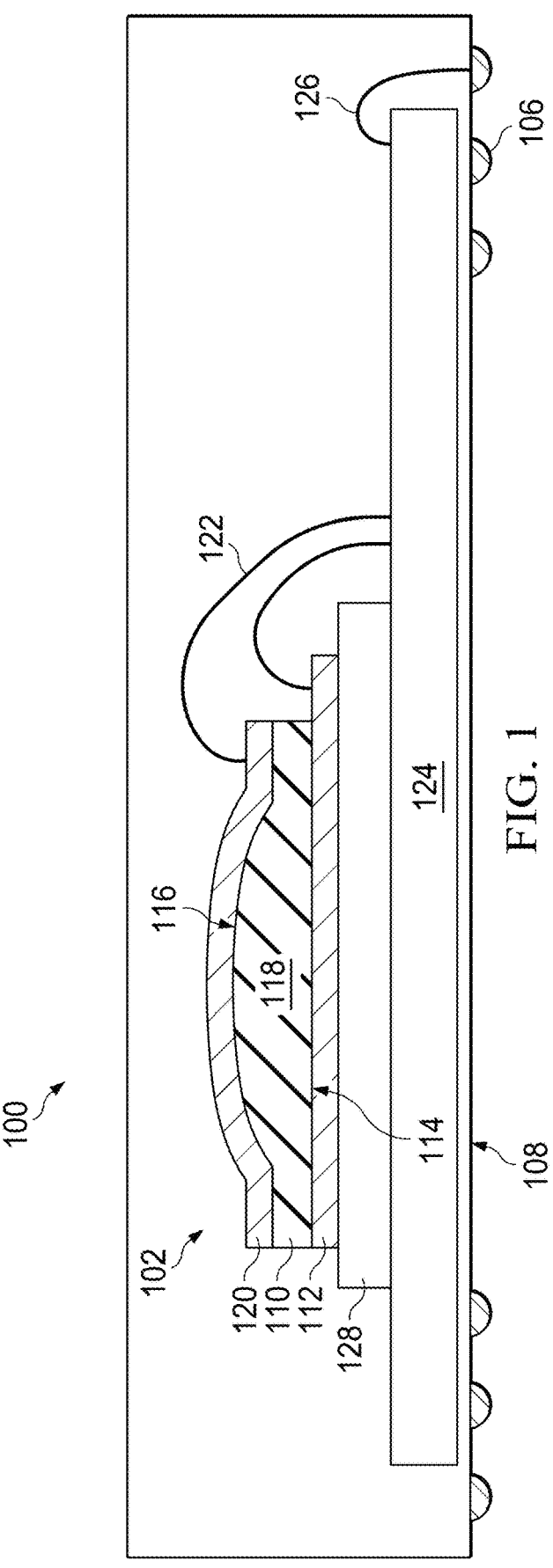
FIG. 1 is a side cross-section view of an example integrated circuit (IC) package including an example BAW resonator having an example convex surface, constructed according to this disclosure.

The drawings are not to scale. Instead, to clarify multiple layers and regions, the thickness of the layers may be enlarged in the drawings. Wherever possible, the same reference numbers are used throughout the drawings and this description to refer to the same or like parts. As used in this description, stating that any part (e.g., a layer, film, area, or plate) is in any way positioned on (e.g., positioned on, located on, disposed on, or formed on, etc.) another part indicates that the referenced part is either in contact with the other part, or that the referenced part is above the other part with one or more intermediate part(s) located therebetween. Stating that any part is in contact with another part means that no intermediate part is between the two parts. Terms such as up, down, top, bottom, side, end, front, back, etc. herein are used with reference to an example orientation. But if a different orientation is considered, such terms must be correspondingly modified. Connecting lines or connectors shown in the drawings represent example functional relationships and/or physical or logical couplings between the various elements.

The performance of devices, such as modern wireless communication devices, depends heavily on the accuracy and noise level of the clock signals used in a system. Such systems necessarily need high-frequency, and high quality factor (Q) resonators. Q is a dimensionless parameter that reflects the under-damping of an oscillator, and characterizes a resonator's bandwidth relative to its center frequency. The Q of known BAW resonators are 10 to 100 times lower than the intrinsic limitations of the piezoelectric material. To improve the performance of BAW resonators, example BAW resonators including a piezoelectric layer having a convex surface are disclosed herein. The example convex surface of a piezoelectric layer retains more acoustic energy in the active area of the BAW resonator, thereby increasing the Q of the BAW resonator (e.g., by a factor or two or higher), and, in turn, the performance of a system. As will be described, the example piezoelectric layers having a convex surface disclosed herein can be formed using processing steps compatible with complementary metal-oxide semiconductor (CMOS) manufacturing processes. For instance, convex surfaces of piezoelectric materials can be form using gray-scale lithography, shaped lithography, sloped lithography, etc.

FIG. 1 is a side cross-section view of an example IC package 100 having an example BAW resonator 102 disposed in the example IC package 100. The example IC package 100 of FIG. 1 is a surface mount device with a plurality of contacts (an example of which is designated at reference numeral 106) on a bottom side 108. However, the example IC package 100 may be of any type, and may have any form, material(s), shape, dimension(s), number of contacts, shape of contacts, etc. Moreover, the BAW resonator 102 and/or any other components may be packaged, mounted, etc. in the IC package 100 in any way. The example IC package 100 may be, for example, a semiconductor-based device. In some examples, the IC package 100 is a wafer-level package, or a die-level package.

The example BAW resonator 102 of FIG. 1 includes a piezoelectric layer 110 disposed on (e.g., deposited on, formed on, etc.) an example electrode 112. In the illustrated example of FIG. 1, at least a portion of a bottom surface 114 of the piezoelectric layer 110 that is in contact with the electrode 112 is a planar surface, and the electrode 112 is a planar structure. However, the bottom surface 114 and the electrode 112 may be formed to have other shapes. For example, they may also have convex shapes. In the case of a semiconductor-based IC package, the example piezoelectric layer 110 may include a piezoelectric material compatible with a CMOS manufacturing process, such as aluminum nitride, zinc oxide, etc. In some examples, the BAW resonator 102 is built on a sacrificial layer which later becomes a released substrate to form a free-standing thin-film resonator. In other examples, the BAW resonator 102 is built on one or more acoustic reflectors to form a solidly mounted resonator.

To retain acoustic energy in the BAW resonator 102, the example piezoelectric layer 110 of FIG. 1 is formed to have an example convex surface 116. The example convex surface 116 is opposite the bottom surface 114. That is, in the illustrated example of FIG. 1, the piezoelectric layer 110 has a plano-convex shape (e.g., having a cross-section including a straight line and an outward bowed line opposite the straight line). The example convex surface 116 of FIG. 1 is formed to have a shape that reduces spurious modes, and confines at least some main mode acoustic energy in a central portion 118 of the piezoelectric layer 110. In some examples, confining main mode acoustic energy refers to confining a portion (e.g., a majority) of main mode acoustic energy. By confining main mode acoustic energy in the central portion 118, less acoustic energy leaks out from the BAW resonator 102 to inactive region(s) of the BAW resonator 102, and/or the substrate 128, thereby increasing the Q of the BAW resonator 102, and, in turn, the performance of a system including the example BAW 102 and/or the example IC package 100. Example manufacturing processes that may be carried out to form the convex surface 116 are described below in connection with FIGS. 3A-3E.

As shown in FIG. 1, another example electrode 120 is disposed on (e.g., formed on), at least, the convex surface 116 of the piezoelectric layer 110. As shown, the electrodes 112 and 120 need not have the same dimensions as the piezoelectric layer 110 or each other, and may have different dimensions in different directions. In some examples, the example electrodes 112 and 120 are formed of a conductive material compatible with a CMOS manufacturing process. The electrodes 112 and 120 may be electrically coupled with other components in the IC package 100 and/or external components. For example, the electrode 112, and the electrode 120 may be electrically coupled (shown conceptionally by a bone wire 122 in FIG. 1) to an IC 124 (e.g., a digital logic circuit, an analog circuit, a processor core, a digital signal processor (DSP) core, etc.) implemented in the IC package 100. In some examples, the IC 124 controls and/or uses a clock signal generated using the BAW resonator 102 to perform one or more functions (e.g., down conversion, up conversion, modulation, de-modulation, etc.). The IC 124 and/or one of the electrodes 112 and 120 may be electrically coupled to an external contact 106, as shown conceptually in FIG. 1 with a bond wire 126. In the example of FIG. 1, the bottom planar electrode 112 is disposed on (e.g., deposited on, formed on, etc.) an example substrate (e.g., a carrier wafer, etc.) 128. In some examples, the IC 124 is an IC die, and the BAW resonator 102 is a microelectromechanical system (MEMS) die.

In operation, when a voltage is applied between the electrode 120 on the top convex surface 116, and the electrode 112 on the bottom planar surface 114 of the piezoelectric layer 110, bulk acoustic waves of specific frequencies are generated within the piezoelectric layer 110, forming an electrical resonance response.

While an example manner of implementing the IC package 100 including a BAW resonator 102 having a convex surface 116 in accordance with this disclosure is illustrated in FIG. 1, one or more of the parts illustrated in FIG. 1 may be combined, divided, re-arranged, omitted, eliminated and/or implemented in any other way. Further, an IC package including a BAW resonator having a convex surface in accordance with this disclosure may include one or more parts in addition to, and/or instead of, those illustrated in FIG. 1, and/or may include more than one of any or all the illustrated parts. For example, acoustic reflectors may be included.

Figure 2:
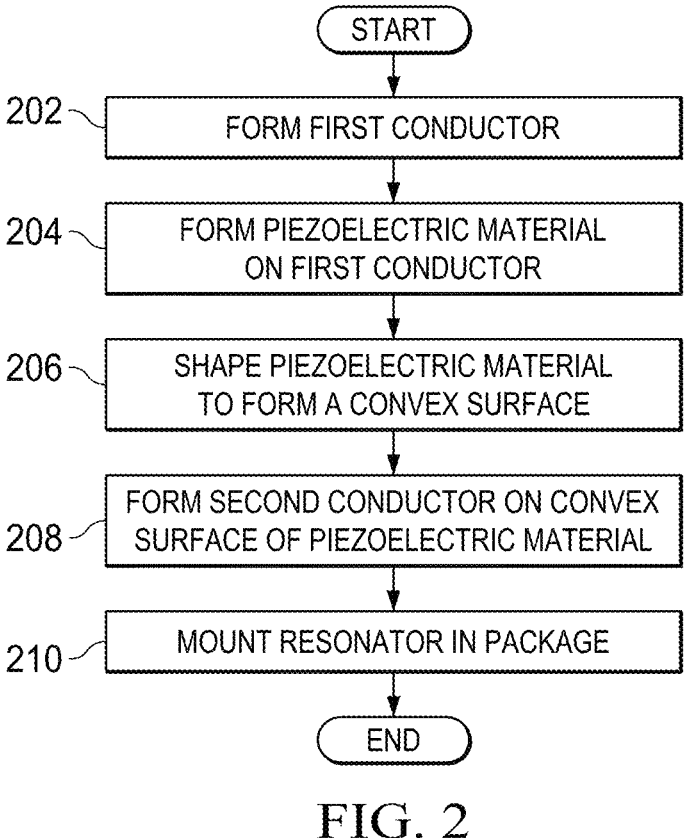
FIG. 2 is a flowchart representing example processes that may be implemented to form BAW resonators having convex surfaces, in accordance with this disclosure.

FIG. 2 is a flowchart representative of example processes that may be carried out to form a BAW resonator having a convex surface. In some examples, one or more processors or controllers that control one or more manufacturing machines or processes (e.g., a lithography process) to implement the example processes of FIG. 2 to form a BAW resonator having a convex surface, in accordance with this disclosure.

The example processes of FIG. 2 include forming a first conductor (e.g., the example electrode 112) on a substrate (e.g., the example substrate 128) (or an acoustic reflector, a sacrificial layer, etc.) (block 202), and forming a layer of piezoelectric material (e.g., the example piezoelectric layer 110) on the first conductor (block 204). As will be described below in connection with examples shown in FIGS. 3A-3E, the piezoelectric material is shaped to form a convex surface (e.g., the example convex surface 116) of a piezoelectric layer (e.g., the example piezoelectric layer 110) (block 206). A second conductor (e.g., the example electrode 120) is formed on the convex surface forming a BAW resonator (block 208). The BAW resonator is then integrated with other active IC (e.g., the example IC 124) and/or passive components, or by itself, and packaged in an IC package (e.g., the example package 100) (block 210).

FIGS. 3A-3E illustrate a non-limiting example method of forming a convex surface (e.g., the example convex surface 116) on the piezoelectric layer (e.g., the example piezoelectric layer 110) of a BAW resonator (e.g., the example BAW resonator 102). The example process of FIGS. 3A-3E can be carried out, for example, during the manufacture of a semiconductor IC using a CMOS manufacturing process. While an example method is shown in FIGS. 3A-3E, portions thereof may be combined, divided, re-arranged, omitted, eliminated and/or implemented in any other way. Moreover, other methods of forming a convex surface on a piezoelectric layer for a BAW resonator can be implemented. For case of understanding, the reference numerals of FIG. 1 are used in FIGS. 3A-3E. Thus, the interested reader is referred to the descriptions of these referenced parts provided above in connection with FIG. 1.

Figures 3A, 3B, 3C, 3D, 3E:
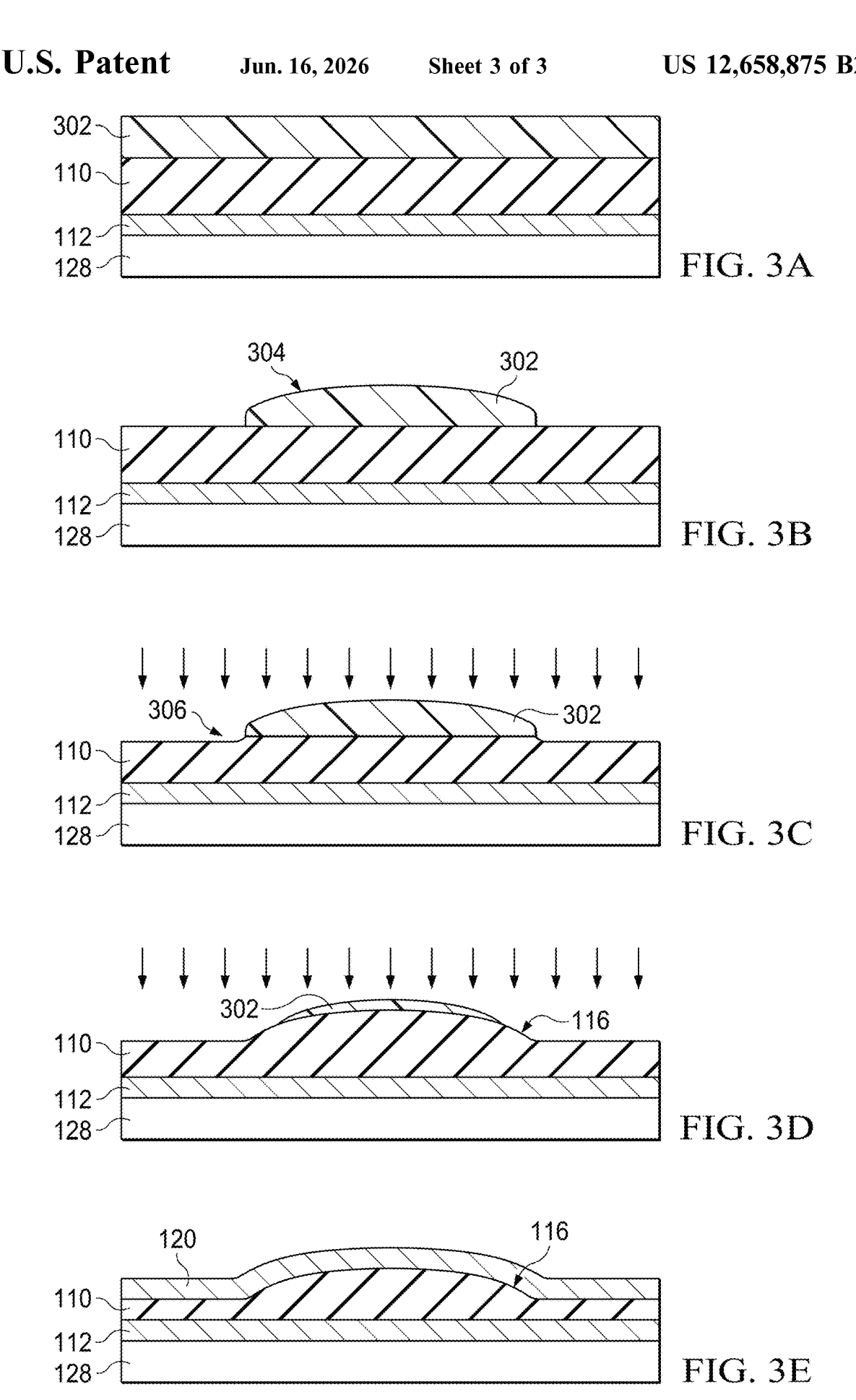
FIGS. 3A, 3B, 3C, 3D and 3E illustrate various stages of an example shaped lithography process for forming a convex piezoelectric surface.

To shape the piezoelectric layer 110, a layer of photoresist 302 is formed on the piezoelectric layer 110 (see FIG. 3A). In some examples, the layer of photoresist 302 is patterned (e.g., shaped) to have a profile 304 (e.g., a shape) corresponding to the desired convex shape of the piezoelectric layer 110 (see FIG. 3B). However, the curvature of the photoresist may not be the same as the final desired convex surface of the piezoelectric layer, depending, for example, on etch rate, chemical reaction, etc. of the fabrication process. In some examples, the layer of photoresist 302 is patterned using a known process such as gray-scale lithography, although other process(es) may be used. In gray-scale lithography, light used to pattern the photoresist 302 passes through a mask having a pitch sufficiently small to create diffraction effects, thus, creating a shaped pattern of light. In the present example, the pattern of light has a shape corresponding to the desired shape of the convex surface 116.

The piezoelectric layer 110 and the patterned photoresist 302 are exposed to an etching solution (signified with the downward arrows in FIGS. 3C and 3D) that, while in contact, continually removes piezoelectric material of the layer 110 and photoresist material 302. Starting at FIG. 3B, etching continually removes an upper layer portion 306 of the piezoelectric material 110, and continually reduces the thickness of the photoresist 302, as shown in FIG. 3C. As etching continues, the piezoelectric material 110 continues to thin at the edges and, as the photoresist 302 is continually etched away, continually exposes more of the convex surface 116 to etching, as shown in FIG. 3D. The etching of the photoresist 302 continually moves inward, thus, forming the convex surface 116. Finally, the conductor 120 is formed on the convex surface 116, as shown in FIG. 3E.

Any references, including publications, patent applications, and patents, cited herein are hereby incorporated by reference to the same extent as if each reference were individually and specifically indicated to be incorporated by reference and were set forth in its entirety herein.

Modifications are possible in the described embodiments, and other embodiments are possible, within the scope of the claims.

What is claimed is:

1. An apparatus comprising:
   an acoustic resonator including:
      an electrode; and
      a piezoelectric layer on the electrode, in which the electrode covers entirely a surface of the piezoelectric layer, and the piezoelectric layer has a convex portion with a non-uniform thickness.

2. The apparatus of claim 1, wherein the surface of the piezoelectric layer is a planar surface, and the convex portion has a convex surface opposing the planar surface.

3. The apparatus of claim 1, further comprising a substrate, and the acoustic resonator is on the substrate.

4. The apparatus of claim 1, further comprising an acoustic reflector, and the acoustic resonator is on the acoustic reflector.

5. The apparatus of claim 1, wherein the electrode is a first electrode, and the acoustic resonator includes a second electrode on the convex portion of the piezoelectric layer.

6. The apparatus of claim 1, wherein the piezoelectric layer includes at least one of: aluminum oxide, or zinc oxide.

7. The apparatus of claim 1, wherein the convex portion is configurable to perform at least one of: reducing a spurious mode, confining a main mode in a central portion of the piezoelectric layer, or reducing a leakage of acoustic energy from the acoustic resonator.

8. The apparatus of claim 1, further comprising a semiconductor die coupled to the acoustic resonator, and the semiconductor die and the acoustic resonator is in an integrated circuit package.

9. The apparatus of claim 8, wherein the acoustic resonator is configurable to provide a clock signal to the semiconductor die.

10. The apparatus of claim 8, wherein the acoustic resonator is mounted on the semiconductor die.

11. The apparatus of claim 8, wherein the acoustic resonator is coupled to the semiconductor die via bond wires.

12. The apparatus of claim 1, wherein the acoustic resonator is a bulk acoustic wave (BAW) resonator.

13. An integrated circuit (IC) comprising:
   an acoustic resonator including:
      an electrode; and
      a piezoelectric layer on the electrode, in which the electrode covers entirely a surface of the piezoelectric layer, and the piezoelectric layer has a convex portion with a non-uniform thickness.

14. The IC of claim 13, wherein the surface of the piezoelectric layer is a planar surface, and the convex portion has a convex surface opposing the planar surface.

15. The IC of claim 13, further comprising a substrate, and the acoustic resonator is on the substrate.

16. The IC of claim 13, further comprising an acoustic reflector, and the acoustic resonator is on the acoustic reflector.

17. The IC of claim 13, wherein the electrode is a first electrode, and the acoustic resonator includes a second electrode on the convex portion of the piezoelectric layer.

18. The IC of claim 13, wherein the piezoelectric layer includes at least one of: aluminum oxide, or zinc oxide.

19. The IC of claim 13, further comprising a semiconductor die coupled to the acoustic resonator.

20. The IC of claim 19, wherein the acoustic resonator is mounted on the semiconductor die.

* * * * *